United States Patent
Liaw (10) Patent No.: US 8,120,939 B2
(45) Date of Patent: Feb. 21, 2012

(54) ROM CELL HAVING AN ISOLATION TRANSISTOR FORMED BETWEEN FIRST AND SECOND PASS TRANSISTORS AND CONNECTED BETWEEN A DIFFERENTIAL BITLINE PAIR

(75) Inventor: Jhon Jhy Liaw, Zhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 179 days.

(21) Appl. No.: 12/689,373

(22) Filed: Jan. 19, 2010

(65) Prior Publication Data

US 2011/0069527 A1    Mar. 24, 2011

Related U.S. Application Data

(60) Provisional application No. 61/245,469, filed on Sep. 24, 2009.

(51) Int. Cl.
*G11C 17/10* (2006.01)

(52) U.S. Cl. ........................................ 365/104; 365/103

(58) Field of Classification Search .................. 365/104, 365/103, 94
See application file for complete search history.

(56) References Cited

U.S. PATENT DOCUMENTS

| | | | |
|---|---|---|---|
| 6,344,990 B1 * | 2/2002 | Matsumiya et al. | 365/63 |
| 6,449,182 B1 * | 9/2002 | Ooishi | 365/63 |
| 6,850,427 B1 | 2/2005 | Prestwich | |
| 2008/0170426 A1 | 7/2008 | Liaw | |
| 2011/0069527 A1 * | 3/2011 | Liaw | 365/104 |

* cited by examiner

*Primary Examiner* — Andrew Q Tran
(74) *Attorney, Agent, or Firm* — Duane Morris LLP (57) ABSTRACT

A semiconductor memory cell array includes an elongated continuous active region. First and second pass transistors are formed in the elongated continuous active region and form part of first and second adjacent memory cells, respectively, of a column of memory cells in the array. An isolation transistor is formed in the elongated continuous active region between the first and second pass transistors and biased in an off state. First and second word lines are coupled to the gates of the pass transistors for applying a reading voltage. The array includes a differential bit line pair including first and second bit lines, a first logic value being encoded into the memory cells by connecting the pass transistors to the first bit line and a second logic value being encoded into the memory cells by connecting the pass transistors to the second bit line.

20 Claims, 5 Drawing Sheets

ROM CELL HAVING AN ISOLATION TRANSISTOR FORMED BETWEEN FIRST AND SECOND PASS TRANSISTORS AND CONNECTED BETWEEN A DIFFERENTIAL BITLINE PAIR

CROSS-REFERENCE TO RELATED APPLICATIONS

This application claims priority to U.S. provisional patent application No. 61/245,469 filed Sep. 24, 2009, entitled "ROM Cell and Array Structure", the entirety of which is hereby incorporated by reference herein.

FIELD OF THE INVENTION

The present invention relates generally to semiconductor memories, and more particularly to semiconductor read-only-memory (ROM) cell array structures.

BACKGROUND OF THE INVENTION

Semiconductor ROM is a type of solid state memory that is fabricated with desired data permanently stored in it. The "on" or "off" state of each memory cell is set by programming the memory. Each memory cell is capable of storing a binary bit of data, representing either a logic state of "0" or "1" depending on whether the path of a bit line to ground (VSS) of the memory cell is electrically connected or electrically isolated.

Designers prefer simple schemes like single end circuits (e.g., inverters) to detect the data state of these memory cells. For example, if the bit line connected to a ROM cell has significant voltage drop (to a lower voltage state) during a read cycle, this condition can represent a logic value of "1." If the bit line of the ROM cell remains unchanged (e.g., at a higher voltage), this condition represents a logical value of "0." The definition of "0" and "1" can be switched. Typically the connection is sensed by detecting a significant pull-down on the bit-line, which often involves waiting a significant period for transistor transition and/or settling times to elapse. For high speed ROM design, U.S. Pat. No. 6,850,427 uses differential sensing with a single transistor element to create a differential signal on two bit-lines. However, the single transistor cell structure provides shrinkage challenges for future technology generations, like OD minimum area (small island) induced lithography process margin and integration problems. Conventional ROM cell designs have an OD length that extends only across a range of two transistors. This layout results in problems relating to lithography printing, pattern lifting, line-end shortening, contact landing and CD uniformity. As cell sizes continue to shrink, the lithography process margins shrink. The lithography process margin impacts the patterning and active region CDU, which impacts read current and Vt matching stability. This is due to the tight space allotted for the small island (minimum area) cell environment described above. The conventional layout also has issues with the landing margin when the contact is positioned at a line-end.

As mentioned above, the cell state is detected by a sense amplifier that translates the "on" or "off" state into a logic "1" or a logic "0", respectively, or vice versa. The sense amplifier can detect either voltage or current. A difference, either voltage or current, between the cell transistor's "on" and "off" states should be as large as possible, so that the sense amplifier can quickly and correctly detect the state. In a traditional ROM cell, the difference is largely determined by the cell transistor's channel width and channel length. As the processing technology enters the nanometer era, the cell transistor's channel width and channel length exhibit a significant sensitivity to its layout environments, including the poly (or gate) spacing effect (PSE) and the shallow-trench-isolation (STI) stress effect (LOD) and strain effect. These effects may significantly affect the channel width and channel length, and hence lower the cell transistor's sensing margin.

Differences in source/drain (S/D) area opening, as determined by the gate space, will result in a different junction distribution across the memory array, and therefore impact performance characteristics like device drive current, threshold voltage, and junction leakage. This is known as the aforementioned poly or gate spacing effect (PSE). This effect is also a function of the poly space rule or OD extension rule. Having a similar gate environment across a full cell array is important in cell design.

Recently, the shallow trench isolation (STI) stress effect has been observed. The STI induces a compressive or tensile stress on the transistor S/D regions. If the extension rule of the S/D regions-to-gate is too small, the stress induced $I_{on}$ and Vt shift will vary dramatically when compared to longer extension rules. As such, the transistor's performance will change from layout differences or lithographic misalign induced OD extension imbalances. This results in poor matching performance on cell devices and wide spreads in chip speed. This effect also impacts yield.

Increasing transistor size (cell size) or decreasing the memory's operation speed can compensate for these layout environmental effects, but these modifications impact product cost and/or performance.

There remains a need for an improved ROM cell structure with improved mismatch amongst ROM cells and increased performance without substantially increasing the size or decreasing the speed of the ROM array.

SUMMARY OF THE INVENTION

A semiconductor memory cell array includes an elongated continuous active region. First and second pass transistors are formed in the elongated continuous active region and form part of first and second adjacent memory cells, respectively, of a column of memory cells in the array. An isolation transistor is formed in the elongated continuous active region between the first and second pass transistors and biased in an off state. First and second word lines are coupled to the gates of the pass transistors for applying a reading voltage. The array includes a differential bit line pair including first and second bit lines, a first logic value being encoded into the memory cells by connecting the pass transistors to the first bit line and a second logic value being encoded into the memory cells by connecting the pass transistors to the second bit line.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning electrical communications and the like, such as, "coupled" and "electrically coupled" or "electrically connected," refer to a relationship wherein nodes communicate with one another either directly or indirectly through intervening structures, unless described otherwise.

Figure 1:
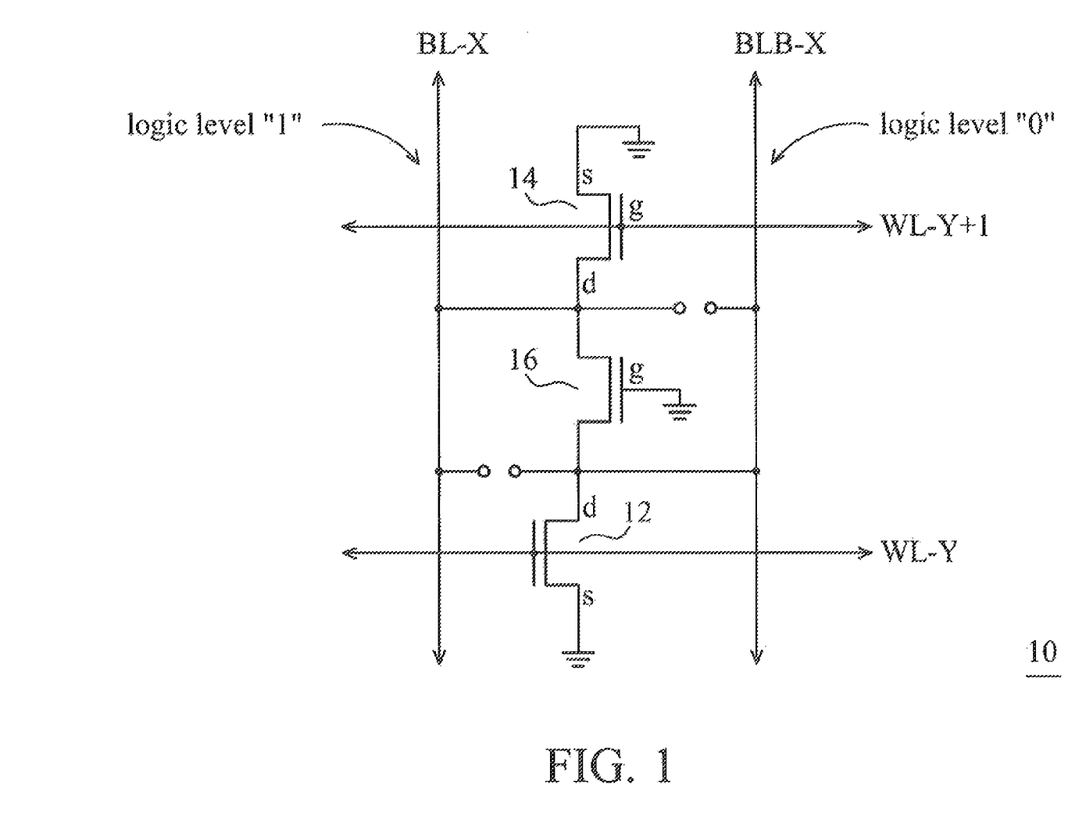
FIG. 1 is a circuit diagram illustrating an embodiment of a pair of ROM memory cells according to the present invention.

FIG. 1 is a circuit diagram of a portion of an exemplary embodiment of a ROM cell array 10. In the illustrated embodiment, each memory cell is made up of at least 1.5 transistors. FIG. 1 illustrates two memory cells in a single column of an array, though it should be understood an array of memory cells will typically include a plurality of rows and a plurality of columns of memory cells. A first memory cell includes a first pass transistor 12 and a second memory cell includes a second pass transistor 14. In the illustrated embodiment, the pass transistors 12 and 14 are NMOS transistors. The source terminals of the pass transistors 12 and 14 are coupled to a ground potential (VSS). The gate terminals of the pass transistors 12, 14 are biased from word lines WL-Y and WL-Y+1, respectively. A reading voltage for activating the transistors 12, 14 is provided through the word lines. Of particular note, the memory cells are encoded with data by the selective connection of the drain terminals of the pass transistors 12, 14 to a differential bit line pair, specifically to one of either BL-X or its inverse BLB-X, where BLB refers to "bit line bar." For example, a connection to BL-X represents that the given memory cell is programmed with a logic level "1", and a connection to BLB-X represents that the given memory cell is programmed with a logic level "0", or vice versa. With specific reference to FIG. 1, the memory cell including pass transistor 12 is programmed with a logic level "0" since its drain terminal is connected to BLB-X, and the memory cell including pass transistor 14 is programmed with a logic level "1" since its drain terminal is connected to BL-X.

During a read, a differential sense-amp can quickly capture the data being read on the differential bit line pair BL-X/BLB-X, either by detecting a relative voltage on one bit line with respect to another or by merely detecting a polarity of a voltage drop across the bit lines. In embodiments, with respect to a given memory cell, bit lines BL-X and BLB-X are charged to an upper power supply voltage. One of the bit lines is pulled down toward a ground voltage by its drain connection to the memory cell's pass transistor and that pass transistor's source connection to the VSS potential), and the other bit line is isolated from the ground potential by the open circuit formed between that bit line and the drain terminal of the pass transistor of the memory cell.

Alternatively, the bit lines may be grounded, with the pass transistor of a given memory cell pulling up one bit line by connection to a power supply voltage and the other bit line remaining at ground. In this embodiment, the terminals of the pass transistors 12, 14 are switched. That is, the drain terminals are connected to a high power supply potential and the source terminal are selectively connected to either BL-X or BLB-X to encode the data.

As mentioned above, each memory cell includes at least 1.5 transistors. That is, as shown in FIG. 1, the two memory cells that include pass transistors 12 and 14 share an isolation transistor 16 disposed between them. In the illustrated embodiment, this isolation transistor 16 is also a NMOS transistor. Essentially, the isolation transistor 16 is a "dummy" device. Transistor 16 is coupled between the drain terminals of the pass transistors 12, 14 and biased at its gate terminal by a ground potential (VSS), thus ensuring the isolation transistor 16 remains at all times in the "off" state. Although the gate is shown as being biased by VSS to turn "off" the isolation transistor 16, a skilled artisan will realize that any other voltage that is lower than the threshold voltage of the isolation transistor 16 can be used to turn "off" the transistor so that it can effectively perform the isolation function. Since the isolation transistor 16 is permanently in an "off" state, it does not perform any electronic function in the ROM cell array and prevents active current from flowing between the adjoining memory cells the active region. Though electrically inactive, the presence of the isolation transistor 16 provides layout benefits thereto, which will be discussed below in connection with FIG. 2.

Figure 2:
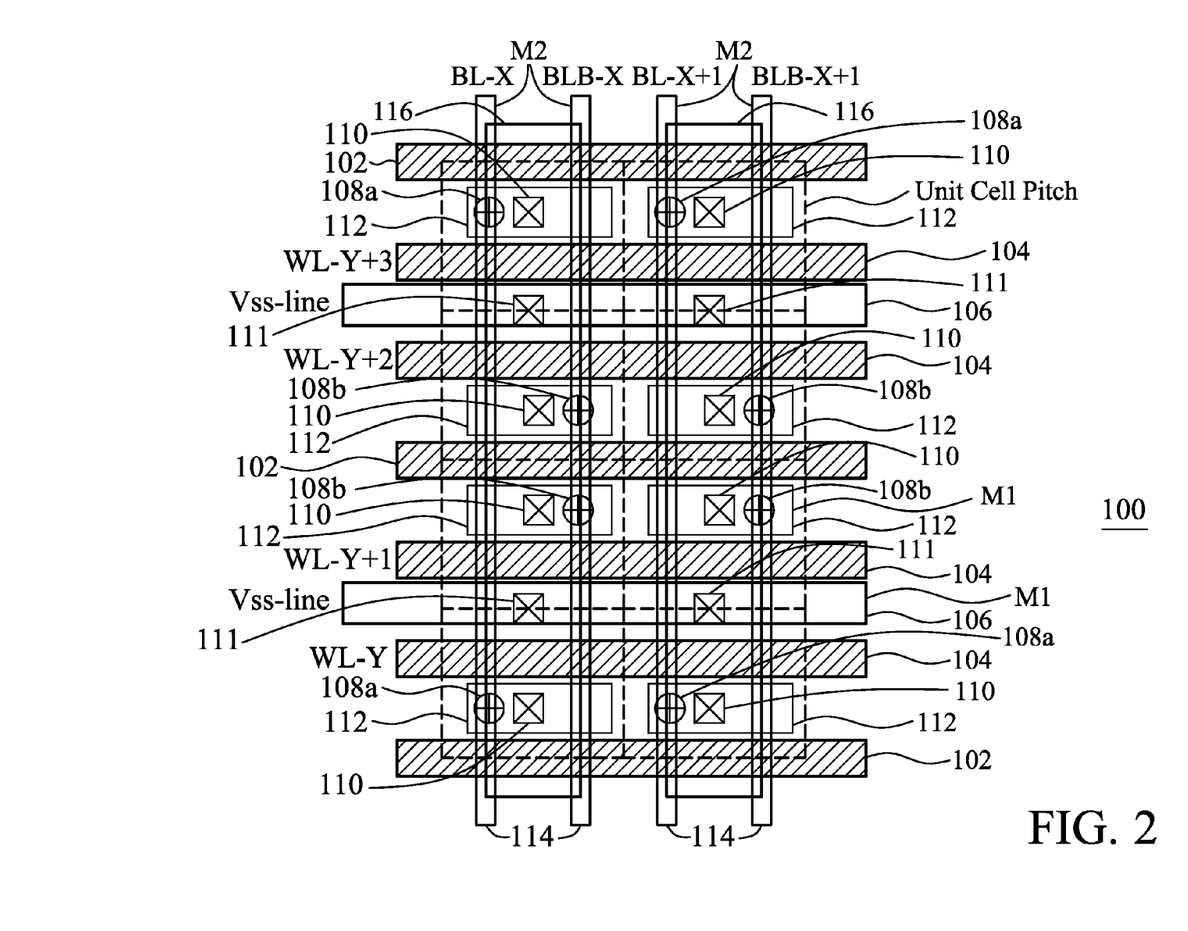
FIGS. 2-4 are layout diagrams illustrating various embodiments of layouts for the ROM memory cell circuit design of FIG. 1.

FIG. 2 is a layout diagram illustrating a layout implementation 100 of an exemplary ROM cell array of FIG. 1. While FIG. 1 shows only two cells, FIG. 2 shows an array having two columns and four rows of cells. A continuous OD or active region 116 runs though all of the pass transistors of a given column of memory cells. The poly (or other material, e.g., metal) gates 104 of the pass transistors are labeled as WL-Y, WL-Y+1, WL-Y+2 and WL-Y+3 according to the word lines to which they correspond. The gates 102 of the isolation transistors are shown as horizontal polysilicon lines disposed between adjacent gates WL-Y+1 and WL-Y+2 and above and below WL-Y and WL-Y+3. Though not shown in the layout of FIG. 2, the gate poly 102 can be connected to a VSS line disposed in, for example, the Metal I, II or III layer. VSS horizontal lines 106 are disposed in the Metal 1 (M1) layer and connected to the source terminals of the pass transistors by source contacts 111. In embodiments, at least two source contacts 111 are provided per VSS line connection to a given source region in order to reduce resistance. M1 horizontal lines 112 are coupled to the drain terminals of the pass transistors by drain contacts 110. The bit lines 114, labeled as first differential pair BL-X/BLB-X and second differential pair BL-X+1/BLB-X+1, are disposed in the Metal 2 (M2) layer and connected to the M1 horizontal lines 112 by either a conductive via 108a or conductive via 108b. A memory cell is programmed to a logical "1" value through the following electrical path: drain terminal of the memory cell's pass transistor, to its corresponding contact 110, to a M1 metal line 112, to a via 108a to BL-X if the memory cell is in the first column (or BL-X+1 if the memory cell is in the second column). Similarly, a memory cell is programmed to a logical "0" value through the following electrical path: drain terminal of the memory cell's pass transistor, to its corresponding contact 110, to a M1 metal line 112, to a via 108b to BLB-X if the memory cell is in the first column (or BLB-X+1 if the memory cell is in the second column).

A third metallization layer (M3) (not shown) can carry the word lines that are electrically connected to the gate poly layer of the pass transistors of the memory cells. In embodiments, these word lines are orthogonal to the bit lines of M2.

The isolation transistors, which include polysilicon gate lines 102, are disposed between the drain regions of adjacent transistors in a column of transistors and effectively isolate the adjacent NMOS pass transistors, which include horizontal polysilicon lines 104 for their gate terminals. The isolation transistor is located on cell boundary (in the Y-direction) between adjacent cells formed in a column of cells in the same OD region, hence the description of each memory cell including 1.5 transistors. The continuous active regions 116 eliminates the need for STI regions between memory cells, which can induce STI stress and strain effects. The polysilicon horizontal line 102 of the isolation transistor in the ROM cell array makes the polysilicon lines of the array more evenly spaced (when compared to the use of STI structures therebetween) and hence alleviates the poly spacing effect to improve device matching. Advantageously, across the full ROM cell array, the pass-devices and isolate-devices have the same gate pitch.

In the layout of FIG. 2, each active region 116 is isolated from adjacent active regions by a field oxide, such as a shallow trench isolation or silicon-on-insulator structure. Uniform stresses are thus applied to the memory cells across an array of cells.

Figure 3:
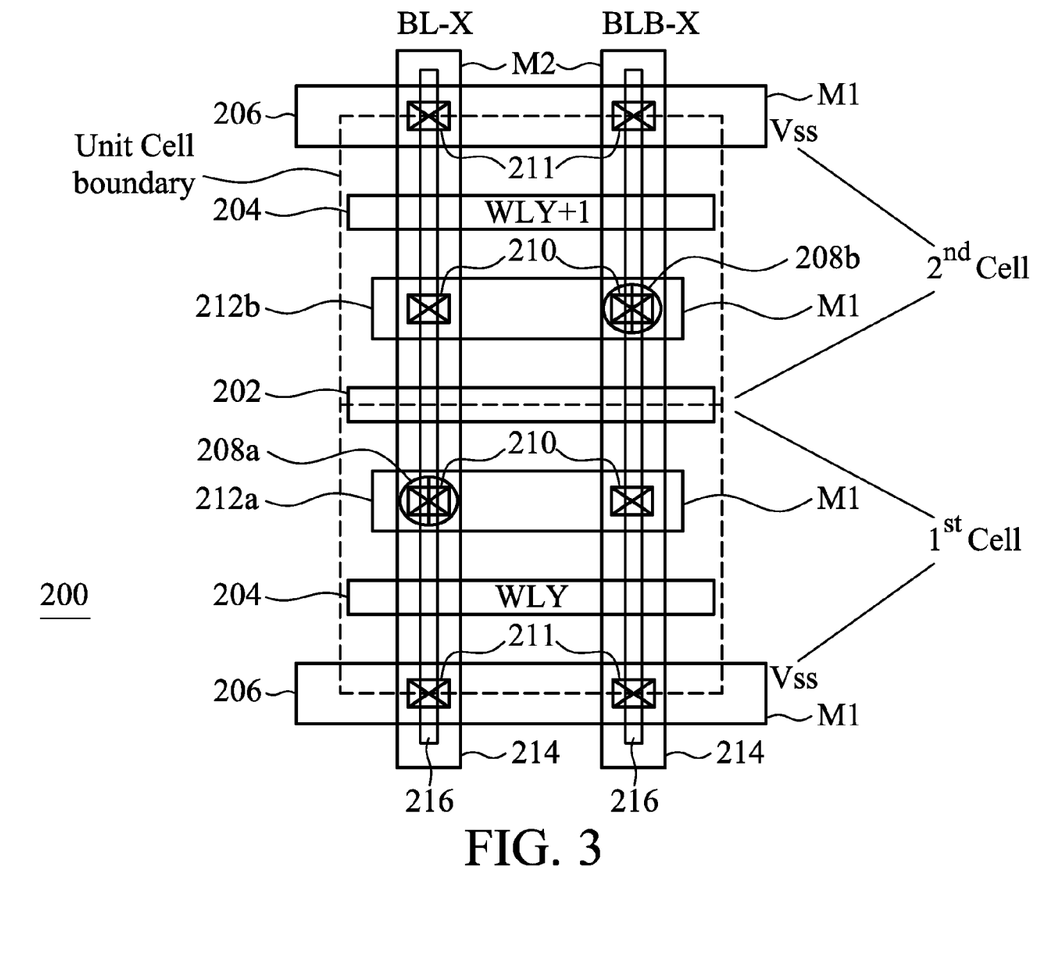

FIG. 3 illustrates an embodiment of a ROM cell array layout 200 where each cell includes three transistors, specifically two parallel-coupled pass transistors and two parallel-coupled half (i.e., shared with an adjacent cell) isolation transistors. More specifically, FIG. 3 illustrates a portion of one column of a cell array. It should be understood that the structure is repeated for multiple columns in the cell array and across multiple rows. The transistors in the array are FinFET transistors. Each column includes two elongated Fin-type active regions 216. The poly line 204 labeled WLY provides the gate of the pass transistors of the first memory cell, and the poly line labeled WLY+1 provides the gate of the pass transistors of the second memory cell. Poly line 202 provides the gate of the parallel-coupled isolation transistors disposed between the first and second pass transistors. The source terminals of the two parallel-coupled pass transistors of the first memory cell are coupled together through contacts 211 to a horizontal VSS line 206 formed in the first metallization layer M1, and the source terminals of the two parallel-coupled pass transistors of the second memory cell are coupled together through contacts 211 to a horizontal VSS line 206 formed in the first metallization layer M1. The drain terminals of the parallel-coupled pass transistors of the first memory cell are each coupled to a horizontal line 212a formed in the M1 layer through contacts 210. The horizontal line 212a is coupled to bit line BL-X, which is formed in the M2 layer, through conductive via 208a, thus encoding the first memory cell with a logical level "1". The drain terminals of the parallel-coupled pass transistors of the second memory cell are each coupled to a horizontal line 212b formed in the M1 layer through contacts 210. The horizontal line 212b is coupled to bit line BLB-X, which is formed in the M2 layer, through conductive via 208a, thus encoding the first memory cell with a logical level "0".

Figure 4:
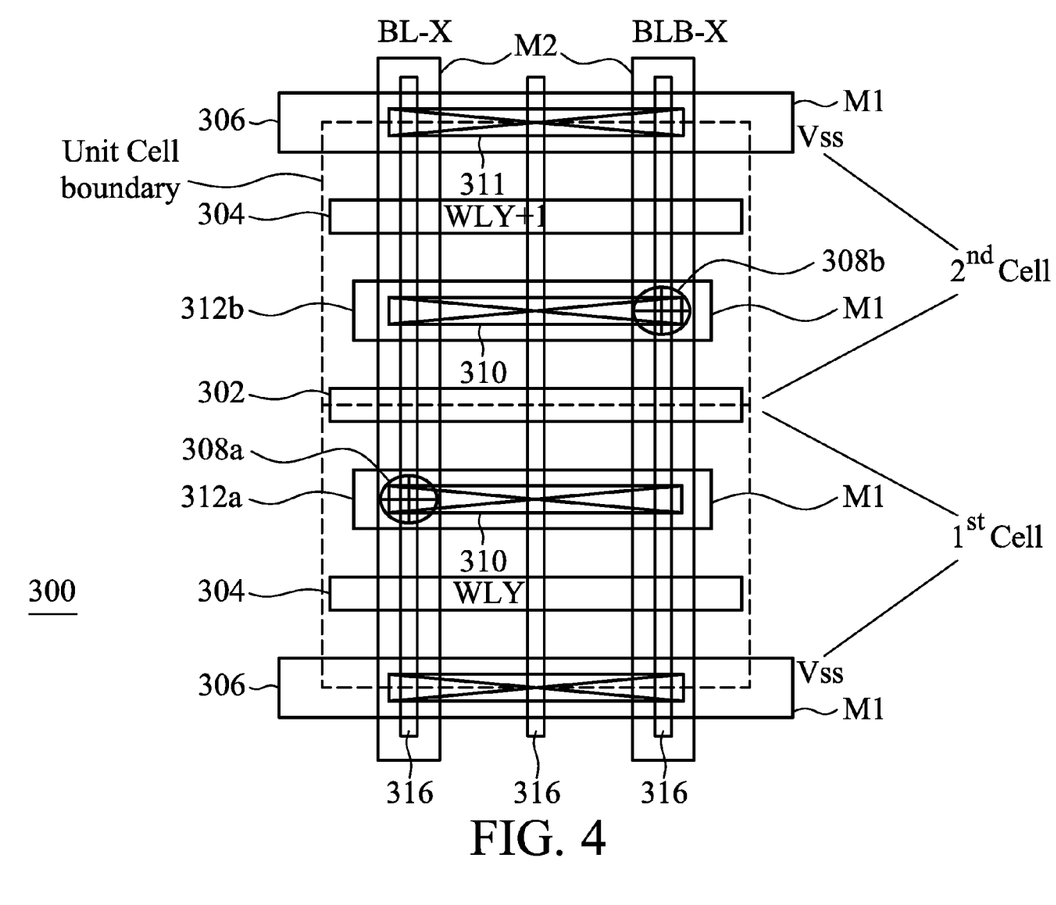

FIG. 4 illustrates an embodiment of a ROM cell array layout 300 where each cell includes 4.5 transistors, specifically three parallel-coupled pass transistors and three parallel-coupled half (i.e., shared with an adjacent cell) isolation transistors. More specifically, FIG. 4 illustrates a portion of one column of a cell array. The transistors in the array are FinFET transistors. Each column includes three elongated Fin-type active regions 316. The poly line 304 labeled WLY provides the gate of the pass transistors of the first memory cell, and the poly line 304 labeled WLY+1 provides the gate of the pass transistors of the second memory cell. Poly line 302 provides the gate of the isolation transistor disposed between the first and second pass transistors. The source terminals of the three parallel-coupled pass transistors of the first memory cell are coupled together through contacts 311 to a horizontal VSS line 306 formed in the first metallization layer M1, and the source terminals of the three parallel-coupled pass transistors of the second memory cell are coupled together through contacts 311 to a horizontal VSS line 306 formed in the first metallization layer M1. The drain terminals of the parallel-coupled pass transistors of the first memory cell are each coupled to a horizontal line 312a formed in the M1 layer through contact 310. Though the connection to the multiple drain terminals is shown as one long contact 310, it should be understood that other configurations, such as multiple contacts or contact with an epitaxial-Si layer, may be employed. The horizontal line 312a is coupled to bit line BL-X, which is formed in the M2 layer, through conductive via 308a, thus encoding the first memory cell with a logical level "1". The drain terminals of the parallel-coupled pass transistors of the second memory cell are each coupled to a horizontal line 312b formed in the M1 layer through contact 310. The horizontal line 312b is coupled to bit line BLB-X, which is formed in the M2 layer, through conductive via 308a, thus encoding the first memory cell with a logical level "0".

Although FIGS. 3 and 4 illustrate embodiments of two and three pass transistors coupled in parallel top operate as one pass transistor in a memory cell, it should be understood that more than three pass transistors could be coupled in parallel as dictated by design parameters. That is, each cell could have multiple pass transistors (e.g., 2 to 32) formed on multiple active regions, i.e., at least one pass transistor per active region). This design is particularly applicable to cells using FinFET devices. In planer MOSFETs, the width size of the device can be increased to increase the transistor current. But for FinFET devices, transistor current is determined by the number of fins. Multiple devices (for a total wider channel width) can be used for high speed designs.

Figure 5:
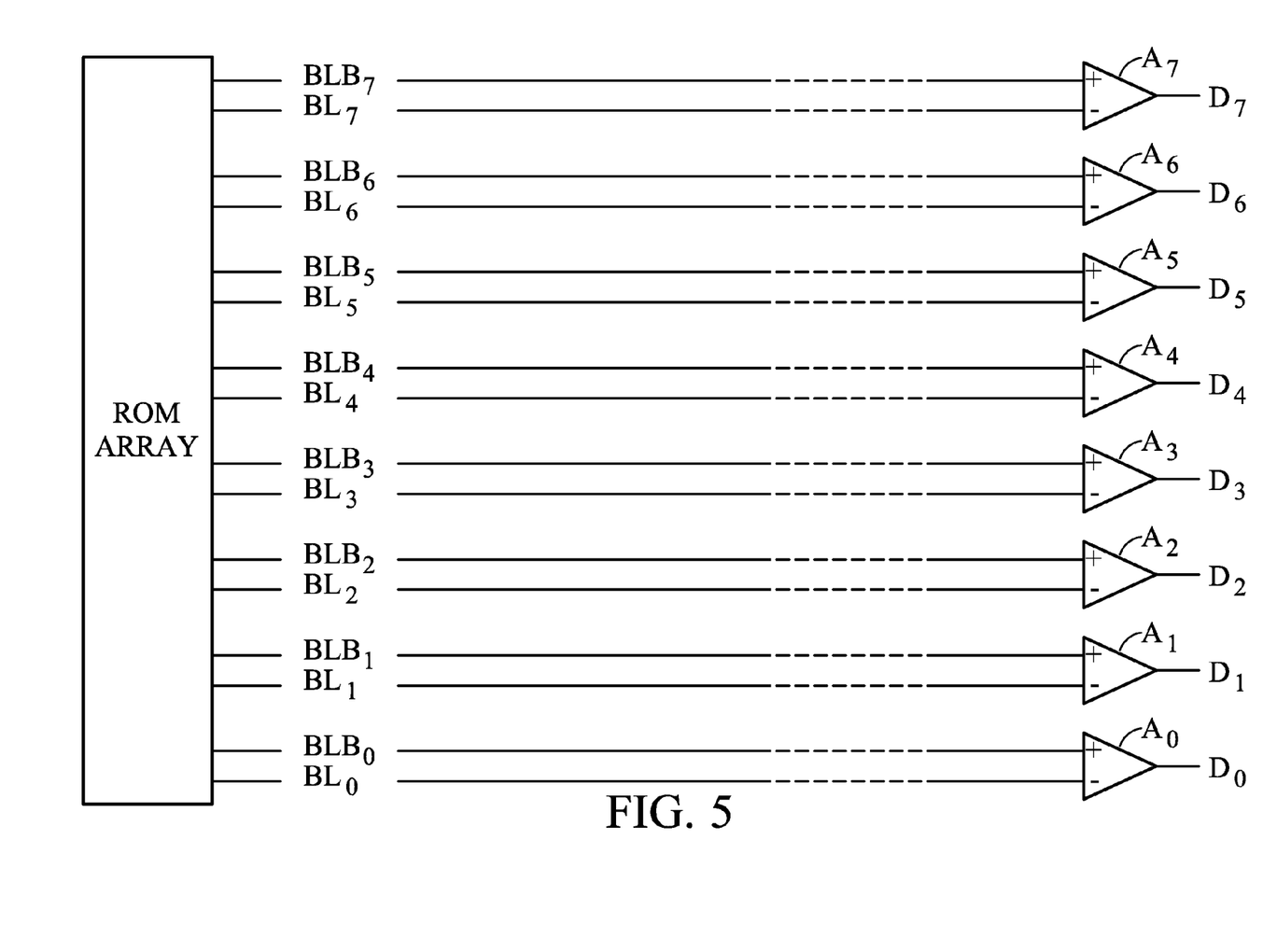
FIG. 5 illustrates an embodiment of a differential sensing circuit.

FIG. 5 is a circuit diagram for a portion of a differentially sensed ROM according to one embodiment of the present invention. The ROM includes a memory cell array such as described above in connection with FIGS. 1-4 with at least 1.5 transistors per memory cell. For illustration purposes only, the ROM array has eight differential bit line pairs $BL_0$/$BLB_0$-$BL_7$/$BLB_7$ corresponding to a plurality of data bits $D_0$-$D_7$ sensed using differential sense amplifiers A0-A7. Those skilled in the art will recognize that selection and routing circuitry may be placed between the bit line pairs and differential sense amplifiers A0-A7 to allow reuse of differential sense amplifiers A0-A7 in reading other bytes (or words or rows) of the ROM array.

Although only NMOS-type ROM cell arrays are described, a skilled artisan may appreciate that the essence of the illustrated concepts, e.g., using permanently-off active device in place of a STI to isolate two adjacent memory cells in the bit line direction coupled with differential sensing techniques, can be equally well applied to PMOS-type ROM cell arrays. A skilled artisan may also realize that replacing the STI with a polysilicon isolation gate will not significantly affect the die size of the ROM cell array.

In embodiments, multiple lines for power mesh can be used to improve both Vss node IR drop (from cell to pad) and metal connection yield. Multiple (rather than a single) contacts can also be provided for yield stability. The use of multiple contacts can reduce the possibility of contact connection (OD-to-metal line) failure. For example, if one failure possibility is X, then the twin contact connection failure possibility is reduced to $X^2$.

The ROM memory cell array and layout described herein utilizes fully symmetrical OD and gate layouts that provide improved lithography patterning process margins and device matching for improved electrical performance. With respect to electrical performance, the design layout provides a fully balanced STI stress effect on all cells even if those cells exhibit poly-to-OD misalignment. The layout improves the OD layer process margin and thus avoids the problems associated with small OD islands in prior art arrays. The same gate spacing is provided for each cell, thus providing fully balanced electrically performance across the array. The device, therefore, does not suffer from the so-called gate spacing effect.

The ROM cell array utilizes a differential sensing scheme that can achieve high speed, small size (akin to single transistor cells) and process robustness. The new ROM does not encounter problems associated with active region minimum area, and therefore has great potential for continues shrinkage. The design is well suited for high speed application, for example those operating at 2 GHz and up.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A semiconductor memory cell array comprising:
   an elongated continuous active region;
   first and second pass transistors formed in the elongated continuous active region and being part of first and second memory cells, respectively, the memory cells being adjacent cells in a column of memory cells in the semiconductor memory cell array;
   an isolation transistor formed in the elongated continuous active region between the first and second pass transistors and biased in an off state;
   first and second word lines coupled to gates of the first and second pass transistors, respectively, for applying a reading voltage; and
   a differential bit line pair including first and second bit lines, a first logic value being encoded into the memory cells by connecting the pass transistors to the first bit line and a second logic value being encoded into the memory cells by connecting the pass transistors to the second bit line.

2. The semiconductor memory cell array of claim 1, wherein the first and second pass transistors are NMOS transistors, wherein the first logic value is encoded into an individual memory cell by connecting a drain terminal of the corresponding NMOS transistor to the first bit line and the second logic value is encoded into the individual memory cell by connecting the drain terminal to the second bit line.

3. The semiconductor memory cell array of claim 2, wherein source terminals of the first and second pass transistors are coupled to a ground potential (VSS) node.

4. The semiconductor memory cell array of claim 3, further comprising a third pass transistor formed in the elongated continuous active region, the third pass transistor forming a third memory cell, the third memory cell being adjacent the second memory cell in the column of memory cells in the semiconductor memory cell array without an isolation transistor formed therebetween, wherein the source terminal of the first pass transistor is coupled to a first VSS line and the source terminals of the second and third pass transistors are coupled to a second VSS line.

5. The semiconductor memory cell of claim 1, wherein the first and second bit lines run parallel to an elongated dimension of the active region and the word lines are orthogonal to the bit lines.

6. The semiconductor memory cell of claim 1, wherein the semiconductor memory cell array includes a first metallization layer and a second metallization layer, wherein the bit lines are formed in the second metallization layer, wherein the first and second pass transistors are coupled to the first metallization layer by one or more contacts, wherein the first and second logic values are encoded into the memory cells by selective via connection from the first metallization layer to the first or second bit line in the second metallization layer.

7. The semiconductor memory cell of claim 1, wherein the first memory cell is encoded with the first logic value by connection of the first pass transistor to the first bit line and the second memory cell is encoded with the second logic value by connection of the second pass transistor to the second bit line.

8. The semiconductor memory cell of claim 1, wherein the memory cells are read only memory cells.

9. The semiconductor memory cell of claim 1, wherein the isolation transistor is a NMOS transistor and a gate terminal of the isolation transistor is coupled to a node biased at a value less than the threshold value of the isolation transistor.

10. The semiconductor memory cell of claim 1, further comprising a differential sensing circuit coupled to the differential bit line pair.

11. The semiconductor memory cell of claim 1, wherein the first and second pass transistors are FinFET transistors.

12. The semiconductor memory cell of claim 11, wherein the FinFET transistors each comprise multiple transistors.

13. A semiconductor memory cell array comprising:
    a plurality of parallel elongated continuous active regions;
    a plurality of first pass transistors formed in the elongated continuous active regions, wherein the first pass transistors are electrically connected in parallel with source nodes electrically connected together and drain nodes electrically connected together, the plurality of first pass transistors being part of a first memory cell;
    a plurality of second pass transistors formed in the elongated continuous active regions, wherein second pass transistors are electrically connected together and drain nodes of the second pass transistors are electrically connected in parallel with source nodes electrically connected together and drain nodes electrically connected together, the plurality of second pass transistors being part of a second memory cell, the second memory cell being adjacent the first memory cell in a column of memory cells in the semiconductor memory cell array;
    an isolation device comprising a plurality of parallel-coupled isolation transistors formed on the elongated continuous active regions between the plurality of first and second pass transistors, wherein the isolation transistors are biased in an off state;
    a first word line coupled to gates of the first pass transistors for applying a reading voltage to the first memory cell;
    a second word line coupled to gates of the second pass transistors for applying a reading voltage to the second memory cell; and
    a differential bit line pair comprising first and second bit lines, a first logic value being encoded into the memory cells by connecting the pass transistors to the first bit line and a second logic value being encoded into the memory cells by connecting the pass transistors to the second bit line.

14. The semiconductor memory cell array of claim 13, wherein the first and second pass transistors are FinFET transistors.

15. The semiconductor memory cell array of claim 14, wherein the first and second pass transistors are NMOS transistors,
wherein the first logic value is encoded into an individual memory cell by connecting drain terminals of the corresponding NMOS transistors to the first bit line and the second logic value is encoded into the individual memory cell by connecting the drain terminals to the second bit line, and
wherein source terminals of the first and second pass transistors are coupled to a ground potential (VSS).

16. The semiconductor memory cell array of claim 15, further comprising a plurality of third pass transistors formed in the elongated continuous active regions, the third pass transistors forming a third memory cell, the third memory cell being adjacent the second memory cell in the column of memory cells in the semiconductor memory cell array without an isolation transistor formed therebetween, wherein the source terminals of the first pass transistors are coupled to a first VSS line and the source terminals of the second and third pass transistors are coupled to a second VSS line.

17. The semiconductor memory cell array of claim 13, wherein the memory cells are read only memory cells.

18. A semiconductor read-only memory cell array comprising:
an elongated continuous active region;
a first NMOS pass transistor formed in the elongated continuous active region, the first pass transistor forming part of a first memory cell;
a second NMOS pass transistor formed in the elongated continuous active region, the second pass transistor forming part of a second memory cell;
a third NMOS pass transistor formed in the elongated continuous active region, the third pass transistor forming part of a third memory cell;
first, second and third word lines coupled to the gates of the first, second and third pass transistors, respectively, for applying a reading voltage to the first, second and third memory cells;
a differential bit line pair comprising first and second bit lines, wherein data is encoded into the memory cells by selectively connecting the drain terminals of the pass transistors to one the first and second bit lines, wherein connection to the first bit line encodes a first logic value and connection to the second bit line encodes a second logic value, wherein the source terminals of the pass transistors are coupled to a ground potential (VSS);
a NMOS isolation transistor formed on the elongated continuous active region between the first and second pass transistors, wherein a gate terminal of the isolation transistor is biased such that the isolation transistor is in an off state;
wherein the second and third pass transistors share a common source region formed in the elongated continuous active region.

19. The semiconductor read-only memory cell array of claim 18, further comprising:
a first source line to which the source terminal of the first pass transistor is coupled; and
a second source line to which the common source region of the second and third pass transistors is coupled.

20. The semiconductor read-only memory cell array of claim 18, wherein the semiconductor memory cell array includes a first metallization layer and a second metallization layer, wherein the bit lines are formed in the second metallization layer, wherein each pass transistor is coupled to the first metallization layer by one or more contacts, wherein data is encoded into a memory cell by selective via connection from the first metallization layer to the first or second bit line in the second metallization layer.

* * * * *